United States Patent [19]
Feigenbaum

[11] Patent Number: 5,737,508
[45] Date of Patent: Apr. 7, 1998

[54] METHOD FOR SMOOTHING FRACTALLY-CURVED LINES

[75] Inventor: Mitchell Feigenbaum, New York, N.Y.

[73] Assignee: Hammond, Incorporated, Maplewood, N.J.

[21] Appl. No.: 300,135

[22] Filed: Sep. 2, 1994

Related U.S. Application Data

[62] Division of Ser. No. 149,650, Nov. 5, 1993, Pat. No. 5,355,314, which is a continuation of Ser. No. 671,246, Mar. 21, 1991, abandoned, which is a continuation-in-part of Ser. No. 499,143, Mar. 26, 1990, abandoned.

[51] Int. Cl.⁶ ................................................. G06F 15/00
[52] U.S. Cl. .............................................................. 395/142
[58] Field of Search ..................................... 364/420, 449, 364/461; 395/142, 140, 141; 345/131, 133, 134

[56] References Cited

U.S. PATENT DOCUMENTS

| | | | |
|---|---|---|---|
| 5,355,314 | 10/1994 | Feigenbaum | 364/420 |
| 5,467,443 | 11/1995 | Johnson et al. | 395/141 |
| 5,479,590 | 12/1995 | Lin | 395/133 |

OTHER PUBLICATIONS

Fournier/Fussel/Carpenter, "Computer Rendering of Stochastic Models," 8070 Communications of the Association for Computing Machinery, vol. 25, No. 6, pp. 371–384 (Jun. 1982).

*Primary Examiner*—Phu K. Nguyen
*Attorney, Agent, or Firm*—Weil, Gotshal & Manges LLP

[57] ABSTRACT

A method for automatically placing objects on a surface in proximity to corresponding predetermined locations without collision with such locations or other objects by defining a distance dependent attractive force between each object and the corresponding location which increases with increasing distance between the object and the location, and defining distance dependent repulsive force between each object and its neighboring objects and locations, such repulsive force decreasing with increasing distance. The initial position for each object is established in proximity with the corresponding location in accordance with predetermined criteria. Thereafter the motion of the objects under the influence of such forces and of a frictional retarding force are determined by marginally stable incremental integration of such motion. The objects are statically placed at a predetermined target distance from the corresponding location at the position around the location at which the sum of the absolute values of the magnitudes of the forces acting on the object is at a minimum.

1 Claim, 5 Drawing Sheets

METHOD FOR SMOOTHING FRACTALLY-CURVED LINES

This application is a divisional of application Ser. No. 08/149,650, filed Nov. 5, 1993, now U.S. Pat. No. 5,355,314, which is a continuation of application Ser. No. 07/671,246, filed Mar. 21, 1991, abandoned, which is a continuation-in-part of U.S. application Ser. No. 07/499,143 filed Mar. 26, 1990 abandoned.

This invention relates to a method and apparatus for the automatic placement of data items on a surface or within a volume having known dimensional constraints such that the items do not collide or overlap with one another.

BACKGROUND OF THE INVENTION

There are known systems that use a programmed digital computer to place data items on a surface or within a volume having known physical dimensions, such as in locating place names on a map. Such systems use a method whereby a first item is chosen as a reference and the other items are moved relative to the fixed reference item to a position where they do not collide with it. This sequential method is then repeated for each item until a satisfactory solution is obtained. However, this solution may not be optimal in avoiding local congestions, and the amount of time and number of processing steps required for a solution is extremely large. Furthermore, in fields such as computerized cartography, the solutions obtained are not often satisfactory and are more often intermediate, leaving much manual work to the cartographer.

Accordingly, a need exists for an automatic data placement system which can place data items on a surface of known physical dimension constraints without interference, collision, overlap or other visually undesirable relationship among the items and with minimum computer processing time. Furthermore, a need exists for a non-sequential data placement system capable of producing an output which requires little or no post-solution manual activity.

SUMMARY OF THE INVENTION

These and other objects of the invention are achieved in accordance with the present invention by a method and apparatus for automatically placing objects on a surface or in a volume in proximity to corresponding locations or with such objects without overlap or collision with such other objects or with such locations, which includes the steps of defining a distance dependent attractive force between each object and the corresponding location, such attractive force increasing with the distance between the object and the corresponding location, and defining for each object a distance dependent repulsive force between such object and other objects and locations in proximity thereto, such repulsive force decreasing with increasing distance between the object and such other objects or locations. An initial position for each object is established in proximity to the corresponding location. Thereafter non-overlapping positions in proximity to the corresponding predetermined location are determined for each object by performing a simultaneous incremental integration of the motion of the objects on the surface under the influence of such forces over an integration period made up a plurality of such elements. The position of the objects and location established by the automatic placement system of the invention is displayed, for instance on a video display or by a printed graphic output.

In accordance with a significant aspect of the invention, the incremental integration of the motion of the objects is made marginally stable so that a substantial amplitudes of movement of the objects are possible. In accordance with a further significant aspect of the invention, the objects are grown from a relatively small size to the substantially full size during the incremental integration period to further increase the ability of the objects to move during the integration in order to explore various placements of such objects with respect to one another and such locations.

In accordance with another aspect of the invention, the objects are also statically placed with relation to the locations and each other by determining the position proximate the corresponding location in which the weighted sum of the absolute values of the magnitudes of the forces acting on the object are at a minimum.

In accordance with another aspect of the invention, there is provided an improved method for smoothing lines as the scale of the surface decreases, while maintaining the essential characteristics of such lines.

BRIEF DESCRIPTION OF THE DRAWINGS

In the following description of the preferred embodiment of the invention, reference is made to the following drawings in which.

DETAILED DESCRIPTION OF THE PREFERRED EMBODIMENT

Figure 1:
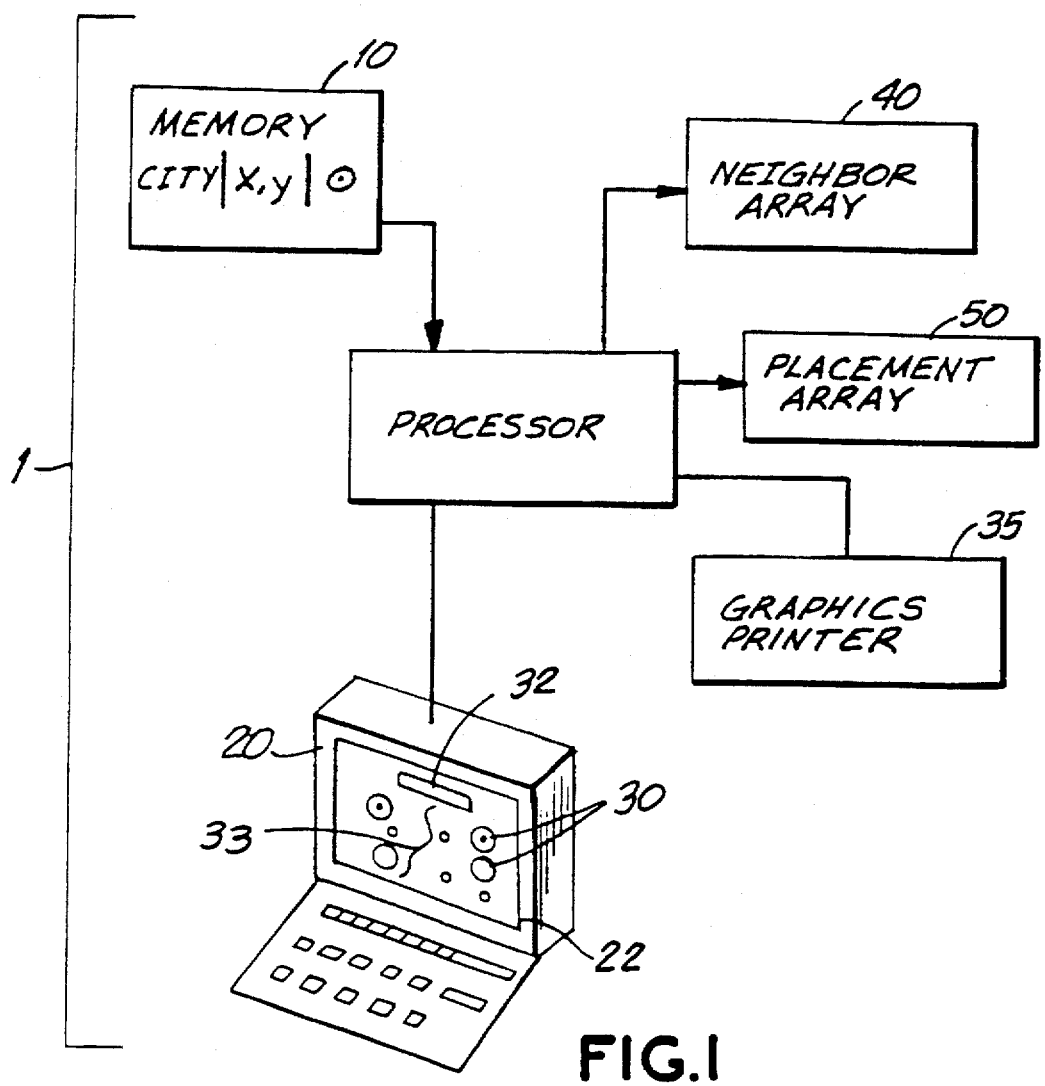
FIG. 1 is a block diagram of major components of the data placement subsystem.

The present invention is described in connection with an embodiment used for optimally placing typeface representing names of places or other cartographic features on a map. The placement information can be used to place the typeface on a map appearing on a video display, or it can be supplied as an input to automated map drawing systems to produce a printed map.

According to the present invention, known, fixed cartographic features on a map, for example, cities and rivers and their corresponding identifiers may be viewed as electrically charged physical objects related beth to one another and to other cartographic features and identifiers by certain physical forces.

In the case of cities, the corresponding names may be viewed as electrically charged typeface field rectangles of predetermined dimensions which are able to move on an insulating frictional surface. Each city may be viewed as an electrically charged circular location symbol of predetermined radius. The electrical charges on the cities and field rectangles are all of the same polarity, so that the electrostatic coulomb forces between field rectangles and between field rectangles and symbols are all repulsive. Each field rectangle may be viewed as being connected at its center to its corresponding city by a spring under tension. In order to establish an initial equilibrium position of each field rectangle with respect to the corresponding city symbol, the constants in the equations defining the attractive and repulsive forces between the symbol and the field rectangle are set at appropriate values so that the forces are equal and opposite when the distance between the symbol and the field rectangle is at the desired initial equilibrium value.

Next, based on predetermined criteria, other cities or cartographic features, such as rivers or national parks, which are in close proximity to a given city are identified as neighbors of the city. Then for each field rectangle, the vectorial repulsive coulomb forces between it and the neighbors of its corresponding city, and between it and the field rectangles associated with such neighbors are determined.

When the vectorial sum of the above attractive and repulsive forces on a particular field rectangle is equal to zero, the field rectangle is considered to be at an equilibrium position. This position is determined dynamically by simultaneously computing the movements of the field rectangles under the influence of the forces acting on each of them using numerical incremental integration methods for a predetermined integration period. During each increment of integration, the field rectangles move under the influence of the vector sum of the forces acting on the field rectangles at the beginning of the increment. At the end of each increment the vectorial forces are recomputed based on the new positions of the field rectangles, and the new values of forces are used for the next increment.

If each of the field rectangles remained at full size over the entire period of integration, they would block one another, particularly in areas of high congestion, so that their movement would be very limited. A significant aspect of the illustrated embodiment of the invention is that, during the integration period, the field rectangles are gradually grown about their center points from a small size (in the illustrated embodiment zero) to substantially full size. As described in greater detail below, this growth regimen allows easy movement of the field rectangles with little interference from adjacent cartographic features or field rectangles during the early portions of the integration period, when the field rectangles are substantially less than their final full size. This permits the field rectangles to explore alternative positions in arriving at an optimal solution.

Referring to FIG. 1 of the drawings, the names, affiliated symbols and locations of each city or other cartographic symbol to be located on the map are stored in a database array 10 located in a portion of the memory of a programmed computer system 1. As shown in the display 20 in FIG. 1, the location symbols 30 may take the form, for instance, of an open circle, an open circle with an interior circular dot, or a circular dot alone in the case of cities, and in the case of rivers or boundary areas such as national parks, a series of points which form a line 33. The perimeter outline which normally frames a map, indicated as perimeter 22 on the display 20, is treated as an impermeable line which can not be crossed by a field rectangle. The typeface which identifies one of the symbols 30 is shown as a field rectangle 32. Each of the other symbols 30 and the river 33 also have field rectangles 32 associated with them, as will be explained in more detail below.

The objective of the system is to place each field rectangle 32 proximate to its corresponding symbol so such symbols can be easily identified by a viewer without overlapping or colliding with the cartographic features or other field rectangles and without undue local congestion. By "colliding" is meant to touch or overlap with the other symbols or field rectangles.

Figure 2:
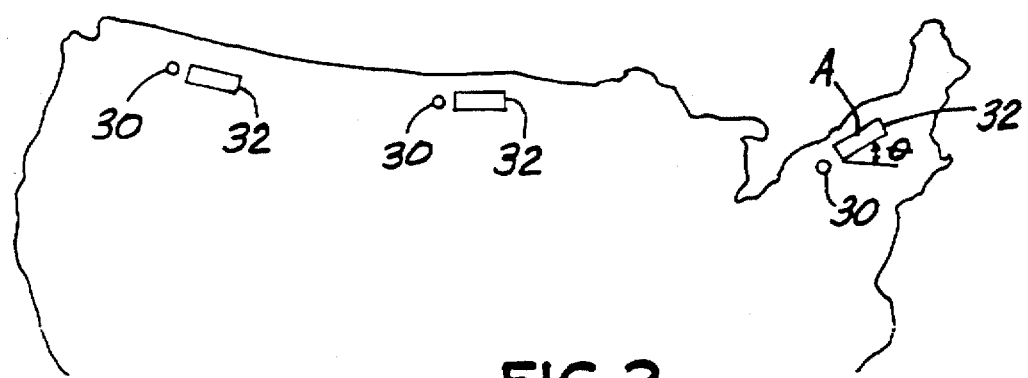
FIG. 2 shows placement of field rectangles on a map with large curvilinear distortion.

The display screen 20 is partitioned as a digital coordinate system which corresponds to the actual latitude-longitude of the map. Since a map of a large area, such as the United States, is a projection of a three dimensional portion of a surface of a sphere onto a two dimensional surface, various types of distortion occur, depending on the type of projection. For instance in the commonly used conical projection, the northern border of the United States is curved concavely. As shown in FIG. 2, according to standard cartographic practice, the names of cities and other features in the map are tilted to follow the lines of latitude. Thus, names in the eastern portion of the map are tilted upwardly to the right while those in the western portion are tilted upwardly to the left.

Figure 11:
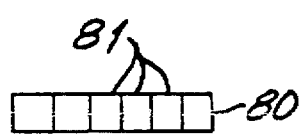
FIG. 11 shows a partitioned field rectangle.

The digital representation of a point's coordinates may be determined in different ways:

(i) If the projected map displays slight curvilinear distortion (e.g.<5%), rectangular coordinates are used and field rectangles are rectilinearly deployed. At the end of placement the sides of the field rectangles are slightly rotated to be tangent to the locally projected parallels;

(ii) For larger curvilinear distortions, the unprojected latitude-longitude coordinates are used, with field rectangles again being rectilinearly deployed. However, the represented size of each field rectangle is reciprocally rescaled so that when projected, it maintains its correct, predetermined size. During the numerical incremented integration period, i.e., when the forces on the field rectangles and associated symbols are simultaneously interactively calculated over several integration increments, and the coordinate positions of each are changed during calculation, according to the method described hereinbelow, these position related rescalings are constantly updated. As shown in FIG. 11, at the end of placement, each field rectangle may be projected as a partitioned field rectangle 80 made up of individual character cells 81, in the sense that corner position and rotation are issued for each constituent character cell 81;

(iii) Alternatively, and preferably, for such larger curvilinear distortions, the vector calculation of the above-described attractive and repulsive forces is done with a locally rotated coordinate system. Referring to FIG. 2, the degree to which a placed field rectangle 32 must be tilted to follow the contour of the map depends upon its position on the map. For example, a field rectangle that identifies a symbol positioned in either the far western or eastern portions of the United States is tilted much more than one identifying a symbol which is closer to the central portion of the United States. Once the degree of curvilinear distortion created by a given projection scheme is known, the system 1 can be programmed to assign a degree of required tilt to each field rectangle depending on its location on the map. For example, if the position at which field rectangle A in FIG. 2 is located requires a tilt given by the angle θ, then, as will be explained in more detail below, the force field for such rectangle is also rotated by the angle θ. In manipulating and calculating the forces, they are projected onto the x and y axis. The solution of the vector forces, using this locally rotated coordinate system allows each field rectangle to tilt in accordance with curvilinear distortion of the map at the point at which it is placed.

The physical dimensions of the typeface field rectangle to be positioned for each city or other cartographic feature are determined by the length of the character string of the name of the feature, the particular type style and size, and the software and type fonts used in the computer system. For each city or cartographic feature datum, the digitally mapped position information, the corresponding symbol and the typeface name of the city are stored in data array 10.

Figure 3A:
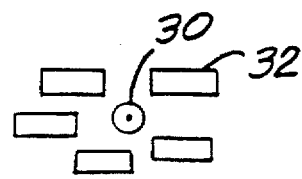
FIGS. 3(a) and (b) show various positions of a field rectangle around a symbol.
Figure 3B:
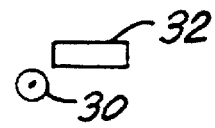

A field rectangle 32 can be placed at any angular position around the symbol 30. Examples of some of such positions are illustrated in FIG. 3(a). Accepted cartographic standards, such as the well known Imhoff standards, consider the position illustrated in FIG. 3(b) to be optimal for ease of reading, and, if possible without collision or serious congestion of the particular area of the map, the name field rectangle is preferably placed there.

Figure 4:
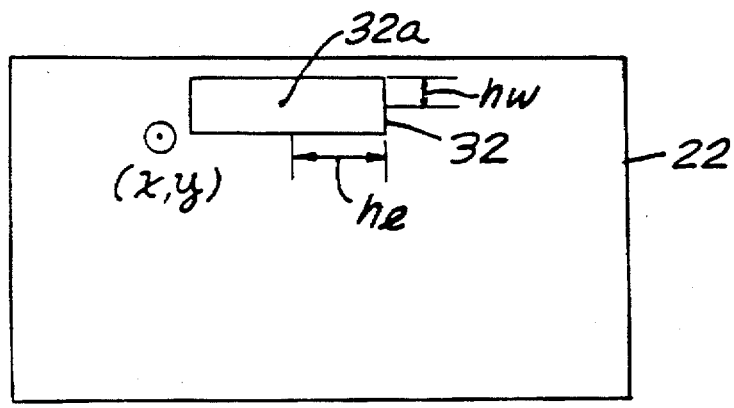
FIG. 4 shows a symbol and affiliated field rectangle positioned on a display.
Figure 5A:
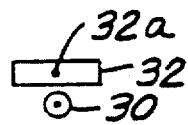
FIGS. 5(a) and (b) are pictorial representations of two possible relationships of a symbol and its affiliated field rectangle.
Figure 5B:
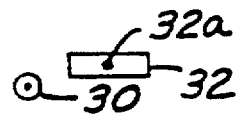

After the data array 10 has been filled by an operator or by a software program, the programmed computer system 1 operates to determine the neighbors of each city or datum to be positioned on the digitized map surface. Referring to FIG. 4, the programmed system examines the position coordinates (x,y) of the first city or datum in array 10, and uses the half-width (hw) and half-length (hl) of the typeface field rectangle 32 corresponding to the first city, and the position coordinates, half-width and half-length of every other entry in the data array 10 to determine which of the other entries in array 10 are to be considered neighbors of the first entry. In the preferred embodiment, a formula is chosen whereby cities or datums are considered to be neighbors if the distance between the associated symbols, as determined by their respective position coordinates, is less than three times the sum of their respective half-lengths or less than three times the sum of the respective half-widths of the associated field rectangles. This process is repeated for each datum entry in data array 10.

Figure 9:
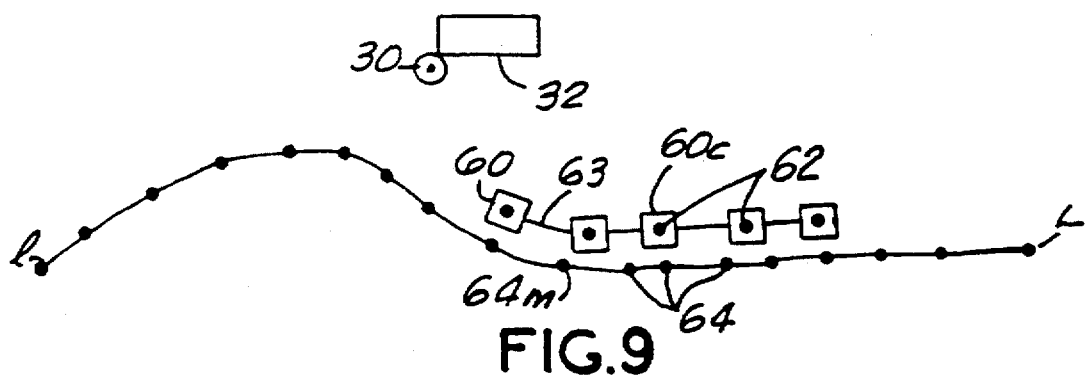
FIG. 9 shows placement of information in connection with line sample data.

Linear features, such as rivers, coast lines, and closed boundaries such as of national parks are defined by charged lines, represented as sets of sampled points of predetermined density as shown generally in FIGS. 9 and 10. For purposes of determining neighbors of a symbol, any sample point on the river or other line data is considered to be a neighbor if the distance between the symbol and the point is less than three times the half-width or half-length of the field rectangle associated with the symbol.

The results of these calculations are stored in a neighbor array 40 which contains entries corresponding to each datum in array 10 and a list of all neighbors of each datum entry in array 10. In order to properly place a symbol's field rectangle, a series of vectorial attractive and repulsive forces are calculated and assigned to each field rectangle and the field rectangles are permitted to move under the influence of these forces until an equilibrium is reached. The velocity at which a field rectangle moves is equal to the vector sum of the forces divided by a term which depends on the predetermined full size of the field rectangle and the friction component between the field rectangle and the surface. These forces include those exerted on each field rectangle 32 by its corresponding symbol, by other symbols, by other field rectangles, by linear cartographic features, and by boundaries representing various physical characteristics of the map area. The attractive and repulsive forces are calculated interactively until the resultant force is approximately zero. This equilibrium position is a location at which a field rectangle can be positioned without collision.

The position of each symbol 30 is fixed on the digitized map surface. In order to determine the initial position for of the corresponding field rectangle 32, the x and y components of an attractive spring force between the symbol and a point 32a (FIG. 4) corresponding to the center of the symbol's associated typeface field rectangle 32, also referred to below as the "centroid", are first established according to the equation $$F_{SF} = K[hl(x-x_0), hw(y-y_0)] \tag{1}$$

where:

k is a spring constant (which is the same for all labels and symbols), hl and hw are the half length and half width, respectively, of the field rectangle, and x and y are the distances along the x and y axis, respectively, of the field rectangle centroid and $x_0$ and $y_0$ are the distances along the x and y axis, respectively, of the associated symbol point.

Equation (1) is actually two equations, one for the x component of the spring force, depending on the quantity $hl(x-x_0)$, and the other for the y component of the spring force which is dependent upon $hl(y-y_0)$. This same notation is used in other equations below for the x and y components of various forces. It can be seen that in the illustrated embodiment, the spring force is anisotropic, ie. its x and y components are determined by the half length and half width of the field rectangle 32. Thus at the same lineal distance the x component is typically substantially larger than the y component.

The programmed system 1 also operates to assign and calculate a repulsive force associated with each city symbol and the centroid 32(a) of its corresponding typeface field rectangle. The repulsion is represented by a coulomb force which is modified to be large, termed "hard core repulsion", when the field rectangle collides with the symbol point 30. In practice, if a field rectangle 32 invades the perimeter of hard core repulsion during an incremental step of integration, in the next time step the direction of the force is reversed (so as to expel it along the direction it invaded) and its magnitude is made sufficiently large to move the field rectangle 32 quickly away from its colliding position.

In the illustrated embodiment, the distances x and y are the distances along the x and y axis, respectively, of the field rectangle centroid, and the distances $x_0$ and $y_0$ are the distances along the x and y axis, respectively, of the associated symbol point. The magnitude of the x and y components of the repulsive coulomb force is determined by the equation $$F_{RS} = K_S \frac{hl(x-x_0), hw(y-y_0)}{\left(\frac{x-x_0}{hl+\rho}\right)^2 + \left(\frac{y-y_0}{\rho+hw}\right)^2 - 1}$$

where:

hl and hw are the half-lengths and half-widths of the field rectangle, respectively, x and y are the distances of the field rectangle centroid along the x and y axis, respectively, and $x_0$ and $y_0$ are the distances along the x and y axis, respectively, of the associated symbol point, $\rho$ is the radius of the symbol associated with the field rectangle, and $k_s$ is a force constant.

Note that in equation (2) and others similar to it, the repulsive force $F_{RS}$ becomes infinitely strong long before $x=x_0$, $y=y_0$ by virtue of the denominator vanishing faster than the numerator. As pointed out above, should the denominator be detected to be negative, then the force is strongly reversed to expel the field rectangle away from the symbol with which it is colliding.

Figure 6:
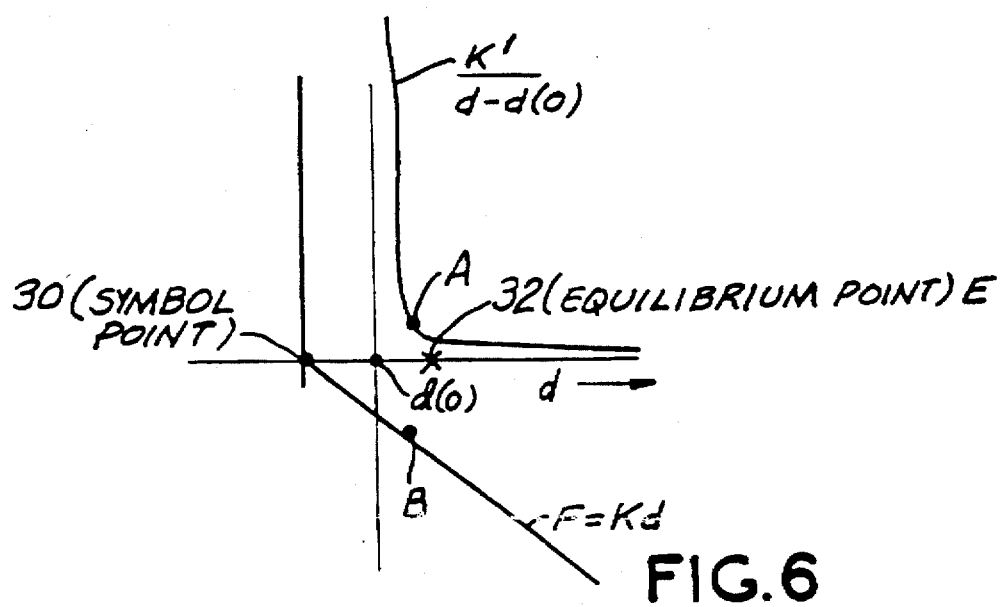
FIG. 6 is a graphical representation of force equilibrium between a symbol and its affiliated field rectangle centroid.

Referring to FIG. 6, it can be seen graphically that, for each symbol in array 10, there is an equilibrium distance E where the sum of the attractive spring force and repulsive coulomb force associated with each field rectangle and its corresponding symbol is zero, i.e., where the value of the repulsive force at point A is equal and opposite to the value of the attractive forces at the point B on the graph. For each symbol in array 10, programmed system 1 calculates the equilibrium distance d(eq) of the centroid by summing the attractive and repulsive forces and setting the quantity equal to zero. The ratio of $k_s/k$ is set so that the equilibrium distance is the desired distance from the label.

Figure 7:
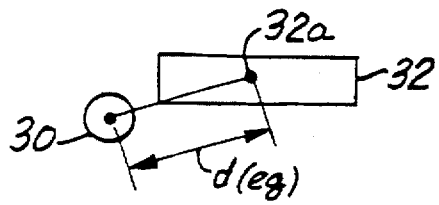
FIG. 7 shows the directional equilibrium between a symbol and its affiliated field rectangle centroid.

In the first embodiment of the invention, the initial equilibrium coordinates for each centroid are established by placing the centroid the equilibrium distance d(eq) away from its corresponding symbol along the direction established by the centroid and the lower left-hand corner of the associated typeface field rectangle, as shown in FIG. 7. The angle $\alpha$ between this direction and the horizontal is easily determined using the half-width "hw" and half-length "hl" of the field rectangle by the relationship tangent $\alpha$=hw/hl. For each datum entry in array 10, the angle $\alpha$ is computed and the centroid 32a of its corresponding field rectangle 32 is moved along that angle the calculated equilibrium distance d(eq) away from the symbol 30. The equilibrium position coordinates of each centroid are stored in a placement array 50 which contains a list of each centroid and its associated equilibrium position. These equilibrium positions are used as the initial conditions for the later-performed incremental integration described in greater detail below. After each increment of integration the position of each field rectangle is noted and the contents of array 50 are updated.

Once the initial equilibrium coordinates of each centroid are stored in the placement array 50, the programmed system 1 then operates to determine the total force on each typeface field rectangle due to each of the other symbols 30 which have been previously determined to 6 pbe neighbors of the symbol associated with the field rectangle. Each field rectangle feels a repulsion from each one of its neighbor symbols whose x and y components are represented by the equation $$F_{os} = \frac{k_N}{n_x} \frac{hl(x-x_o), hw(y-y_o)}{\left(\frac{x-x_o}{hl+\rho}\right)^2 + \left(\frac{y-y_o}{\rho+hw}\right)^2 - 1} \quad (3)$$

where:

$k_n$ is a second force coefficient of the same order of magnitude of $k_s$, x and y are the distances along the x and y axes, respectively, of the field rectangle centroid, $n_x$ is the number of neighbors which exist for the field rectangle in question, and $x_0$ and $y_0$ are the distances along the x and y axis, respectively, of the neighboring symbol point.

This radially directed repulsive force is calculated for each centroid 32a and each of its corresponding neighbor symbols and stored in memory. The fact that each of such forces is divided by the number of neighbors $n_x$ means that the sum of these forces is the average of such forces. The repulsive force is large when the distance between the centroid of the field rectangle and the center of the relevant symbol is less than or equal to $x_0$, so that the field rectangle is swiftly repelled during the integration period from a position where it collides with a neighboring symbol.

The next force calculated and stored by the programmed system 1 is the vector repulsive force exerted on the field rectangle 32 of each symbol 30 by the field rectangles of its neighboring symbols, termed a label-label force. This force is also a coulomb force modified to become hard core if two field rectangles collide. The force is a modified force also in the sense that, it is calculated based on the half-widths or the half-lengths of the respective field rectangles, depending on whether their positional relationship is more vertical or horizontal, respectively. As field rectangles move with respect to one another during integration, the label-label force between two field rectangles can change from horizontal to vertical or vice-versa. Whether the label-label force is horizontal or vertical is determined as follows.

Figure 8:
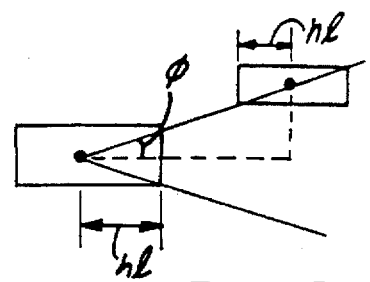
FIG. 8 shows angles used in determining whether the force relationship between field rectangles is horizontal and vertical.

Referring to FIG. 8, first, the system 1 computes an angle $\phi$ given by tan $\phi=\Delta y/\Delta x$ where $\Delta y$ and $\Delta x$ represent, respectively, the difference in the x and y coordinates stored in placement array 50 of the two centroids. Next, an angle $\beta$ is computed according to the relationship tan $\beta$=sum of the half-lengths of the two field rectangles/sum of the half-widths of the two field rectangles. A comparison is then made and, if $\phi$ is greater than $\beta$, the label-label force is horizontal, and if $\phi$ is smaller than $\beta$, the force is vertical.

Horizontal or vertical label-label forces are assigned for the field rectangle 32 of each symbol 30 exerted by the field rectangles of each of its neighbor symbols. The horizontal force is calculated as:

$$F_x = \frac{k_s}{n_x} \frac{hl \cdot hl^1 \left(\frac{x-x^1}{hl+hl^1}\right)}{\left(\frac{x-x^1}{hl+hl^1}\right)^2 - 1} \quad (4)$$

where:

$k_r$ is a force constant, hl and $hl_1$ are the half-lengths of the field rectangle being studied and the field rectangle exerting the x direction label-label force, respectively, x and $x^1$ are the x coordinates of the centroid of the field rectangle for which the forces is being calculated and the field rectangle exerting the force, respectively, and $n_x$ is the number of neighboring field rectangles to the field rectangle being studied.

The equation for the vertical label-label force is essentially similar, with half widths and y coordinates being substituted for half lengths and x coordinates:

$$F_y = \frac{k_r}{n_x} \frac{hw \cdot hw^1 \left(\frac{y-y^1}{hw+hw^1}\right)}{\left(\frac{y-y^1}{hw+hw^1}\right)^2 - 1} \quad (5)$$

It can been seen that the label-label forces are the average of the forces exerted by the neighboring labels since each of the forces is divided by the number of neighbors $n_x$. The label-label forces calculated by equations 4 or 5 act on the respective label in the x or y direction, respectively. Thus, as the relationship between two labels changes from horizontal to vertical, both the magnitude and the direction of the label-label force changes suddenly. In order to reduce or mask the impact of such a sudden change on the system, the programmed subsystem 1 also calculates an average background force which approximates an elliptical force field. This is done simply by vectorially summing up the radially directed coulomb forces exerted on each field rectangle by each chosen neighbor field rectangle. For a field rectangle the component of the background force due to a particular neighbor is calculated by $$F_B = k_b \frac{hl^1\left(\frac{x-x^1}{hl+hl^1}\right), hw^1\left(\frac{y-y^1}{hw+hw^1}\right)}{\left(\frac{x-x}{hl+hl^1}\right)^2 + \left(\frac{y-y^1}{hw+hw}\right)^2} \quad (6)$$

where:

x and y are the coordinates of the field rectangle for which the background force is being calculated, $x^1$ and $y^1$ are the coordinates of the field rectangle exerting the component of background force, hl and hw are the half-length and half-width of the field rectangle for which the background force is being calculated, $hl^1$ and $hw^1$ are the half-length and half-width of the field rectangle exerting the force, $\frac{(x-x^1)}{(hl+hl^1)}$ and $\frac{(y-y^1)}{(hw+hw^1)}$ are the distances along the x and y axes between the centroids of the two field rectangles in units of the sums of their respective half-lengths and half-widths, $k_b$ is the background force constant, and $n_x$ is the number of neighbor field rectangles to the field rectangle in question.

Once all of the forces on each field rectangle are known, incremental numerical integration is performed for a predetermined period in order to allow the charged field rectangles to move on the frictional surface under the influence of the vector sum of the calculated forces. The velocity of motion is determined by the frictional force equation $$F = K_f V \quad (7)$$

where $K_f$ is the coefficient of friction and V is velocity.

The field rectangles 32 are considered to have zero mass, so that acceleration is ignored. For each label, the x-coordinate force is given by $K_{fx}$ dx/dt and the y-coordinate force by $K_{fy}$ dy/dt, where $K_{fx}$ and $K_{fy}$ represent the coefficients of friction. In the illustrated embodiment the velocity V is related to the dimensions of the field rectangle 32 and the coefficients $K_{fx}$ and $K_{fy}$ are selected as, respectively, the half-legnth of the field rectangle and the half-width of the field rectangle. Since corresponding half width and half length terms appear in the force equations 1–6, these terms cancel out in the calculation of the motion of the field rectangles. In this way, the force equations do not vary with the scale of the map and can be used for a map of any size.

In the illustrated embodiment, the integration period is divided into one hundred finite increments of time. The field rectangles are permitted to move during each increment under the influence of the forces acting on them at the beginning of the increment and the amount of movement during the increment and the position at the end of the increment is calculated. The forces are then recalculated at the new positions for use during the next incremental step.

The incremental integrations may result in overlaps or collisions between cartographic elements because, if the velocity of a field rectangle 32 during an increment moves it to an overlapping or colliding position, this fact is not discovered until the positions and forces are recalculated for the next increment of integration. In the event of such a collision or overlap, the direction (or sign) of the force exerted on the field rectangle by the element with which it is in collision is reversed and increased approximately five-fold in magnitude, so that the field rectangle is strongly repelled out of the hard core repulsion distance in the next increment of integration.

For each increment, changes In the initial equilibrium coordinates stored in the placement array 50 are calculated by the equation $\Delta x = V_x \Delta t$ and $\Delta y = V_y \Delta t$ where $\Delta t$ is the duration of the increment. The new coordinates for each field rectangle, are calculated and stored in the placement array 50. The $\Delta x$ and $\Delta y$ data may also be stored in separate data arrays. The new coordinates determined in any increment then serve as the initial coordinates for the next increment and the force equations are recalculated as described above. At the end of the integration period the final output in array 50 is a list of equilibrium coordinates for each centroid 32a.

An important aspect of the present invention, which permits it to freely move and successfully position field rectangles even in highly congested areas of a map during the integration period, is that the during the integration period the field rectangles are initially of zero or relatively small size, and are grown about each centroid 32a during the integration process. Without this growth regimen, the full size field rectangles would be continually colliding with one another and so would experience little relative movement, especially in areas of high congestion. Generally, there exist large numbers of non-colliding placements of field rectangles unless congestion is so high as to physically preclude any placement.

The incremental numerical integration technique used in the present invention also has important advantages. A successful placement is optimal if its local congestions are smallest. During the growth regimen of field rectangles, local congestion can become very large. In this circumstance, it is imperative to allow sudden large motions of field rectangles to explore neighboring placements. This would not occur under genuine infinitesimal integration of the frictional force equations because the forces would change gradually and continuously. In the system of the present invention, by contrast, the increments are deliberately chosen to be large enough, and, as explained below, the system is made marginally stable, to permit substantial motion of the field rectangle during each increment. This, means that a hard core repulsion zone is likely to be entered particularly if the congestion of the area of the map is high.

Since the force computed for the next increment in this circumstance is a large repulsive force, large motions occur during such next increment.

In the illustrated embodiment, the field rectangles are grown during the integration period by multiplying all half-lengths and half-widths by a factor q(t) at the beginning of each incremental of integration. Initially, in this embodiment, q equals 0, so that the size of the field rectangle is essentially equal to its centroid. In course of integration q increases incrementally by the specified growth rule $$q(t)=1-e^{-\mu t}, \quad (8)$$

where "t" increases incrementally for each successive increment of integration. Thus, the aspect ratio of the field rectangle's half-length/half-width does not change, only the scale changes. μ is chosen such that the integration period is equal to approximately 4/μ. In this manner the integration continues for several, in this case 4, time constants, at which time the field rectangles are approximately 99% of full size.

The force constants and incremental time steps are chosen to make the behavior of the system marginally stable. If the integration were too stable, the field rectangles would not move enough to be sure of achieving an optimal solution. An unstable integration would result in divergence from equilibrium. Marginally stability is a condition in which the field rectangles move about freely, but not so freely as to become unstable.

Determination of the value of k to achieve marginally stable behavior is implemented as follows. The incremental time step, t, is chosen so that the integration period is about one hundred such increments. The equation of motion of a field rectangle acted upon only by its corresponding symbol's spring and coulomb repulsive forces is given by $$\frac{dr}{dt} = -kr + \frac{k_s}{r}, \quad (9)$$

where r is the distance between the symbol center and the centroid of its field rectangle.
The equilibrium position (dr/dr=0) is $$r = \sqrt{k_s} \cdot /k \quad (10)$$

Calling x the displacement from equilibrium and expanding the force terms from equation (9) to first order in x, $$\frac{dx}{dt} = -2kx. \quad (11)$$

At the end of a finite increment t, equal to the increment used for the numerical incremental integration, the new displacement x' is $$x'=x-2ktx=(1-2kt)x. \quad (12)$$

The behavior is stable for absolute values of (1−2kt)<1 and marginal at 1−2kt=−1→k=1/t. Once k is chosen, $k_s$ is easily calculated by equation 10.

In accordance with this embodiment of the invention, during the last few incremental time steps of the integration period, each coordinate change is preferably monitored to see what degree of change each field rectangle centroid 32a coordinate is experiencing. If the change in the respective x and y coordinate positions of all centroids during these last incremental steps is less than 1% of the horizontal or vertical dimension of the map, the program successfully terminates and final output data is supplied to the display graphics drivers or to the graphics printer 35 (FIG. 1) which prepares a print out of the map. If some changes are still greater than 1%, those field rectangles and their associated symbols are tagged. The process is then repeated using only the tagged symbols and their corresponding neighbors whereby each field rectangle starts with a size of zero and the new initial position stored in array 50 is the position computed at the end of the last run of integration. If, at the end of the second run of integration the movement of any field rectangle centroid is still greater than 1%, the symbol is flagged for the intervention of an external operator.

Figure 12:
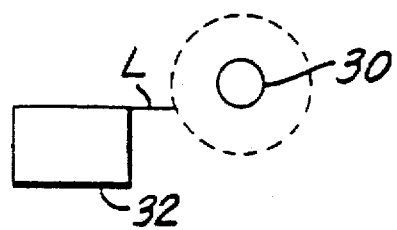
FIG. 12 shows a target radius for placement of a field rectangle with respect to its symbol.

Once the field rectangles 32 have been placed at their equilibrium coordinates, they can optionally be moved along a geometric line (L), as shown in FIG. 12, to a target radius which in the illustrated embodiment is defined as being equal to the symbol radius plus ten percent of the symbol radius.

Other cartographic features of a map which require identification, such as rivers, highways, railroads or other similar line data, may also have their names and locations stored in array 10. As shown in FIG. 9, the names associated with these types of data are represented in array 10 as an articulated chain of individual character cells 60, whose centroids 62 are linked by rigid rods 63. The line data defining the cartographic feature is represented by a set of sample points 64. The distance between the centroids 62 of the character cells in chain 60 is predetermined and fixed in array 10 based on the known dimensions of each character cell. During the integration period, the cells are allowed to move about, but the predetermined distance between cells is kept constant. Each cell is treated as a field rectangle of dimensions specified by the character cell in a given font and is not subjected to the growth regimen above. The centroids of the cells are allowed to move along a smoothed curve parallel to the curve defined by the sample data points but not beyond the endpoints of the sample data points. Since the cell chain is restricted to movement along and parallel to the point line data, it is never permitted to intersect the sample point line data.

Each line data sample point 64 serves as a repelling symbol to any field rectangle 32 and associated centroids 32a which are considered to be neighbors. The neighbor points 64 are stored in the neighbor array 40. During a given increment of integration, just as collision or overlap between field rectangles and symbols can occur, field rectangles may cross over or overlap a river or other cartographic feature represented by a set of line data sample points 64. The magnitude of the repulsive force of the river or other symbol represented by the line data points 64 is directly related to the density of the sample points which form the linear boundary. As with other collisions, in the next increment, the direction, or sign, of the force is reversed and its magnitude increased so that the field rectangle quickly moves away from its colliding position during the incremental integration step.

The equation for determining the repulsive force exerted on a field rectangle by a neighboring portion of a line such as a river, is given by the equation $$F = \sum_i k_w \Delta l \frac{\frac{x-x(l)}{hl}, \frac{y-y(l)}{hw}}{\left(\frac{x-x(l)}{hl}\right)^2 + \left(\frac{y-y(l)}{hw}\right)^2 - (1)} = \quad (13)$$

$$k_w \int_o^L dl \frac{\left(\frac{x-x(l)}{hl}\right), \left(\frac{y-y(l)}{hw}\right)}{\left(\frac{x-x(l)}{hl}\right)^2 + \left(\frac{y-y(l)}{hw}\right)^2}$$

where:

$k_w$ is a force constant; and $(x(l),y(l))$ is parametrization by arclength of linework which when sampled at intervals $\Delta l$, $(x(i\Delta l),y(i\Delta l)) = (x_i,y_i))$ is the $(x(l),y(l))$ of the left-hand side which converges to a limit as the sampling length $\Delta l$ goes to 0.

In placing the character cell chain along the associated line data, the programmed system 1 first determines the midpoint 64m of the line sample data 64 and the central cell 60c of the articulated cell chain. An attractive spring force between the midpoint 64m of the line sample data 64 and the centroid 62 of the central cell 60c attracts the cell to the midpoint 64m of the line sample data 64. A coulomb force between the articulated cell chain and the endpoints O, L, repels the cell chain from the endpoints of the line sample data 64, which force becomes large as the chain approaches either endpoint. If the chain of cells has a ½ length τ, this repulsive force may be expressed as $$F = \frac{k_s}{1-\tau} - \frac{k_s}{L-\tau-1} \quad (14)$$

where $k_s$ is a force constant, and 1 is the variable position of the articulated cell chain along the associated line.

A repulsive coulomb force projected along the direction of the line sample data 64 from other neighbor field rectangles and symbols associated with each sample point is also calculated. Additionally, there is a force on the cell chain which is proportional to the curvature of the line sample data 64 such that if the curvature of the line sample data 64 becomes too severe, this force becomes repulsive. This force is given by $k_c/r^2$ where r is the local radius of curvature. As described above in connection with field rectangle 32, during integration, the cell chain moves under the influence of the vector sum of the forces. The final equilibrium position of the character cell chain is determined by the arc length along the sample curve from one of its ends to the centroid of the central cell of the chain.

Figure 10A:
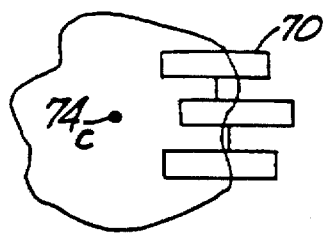
FIGS. 10(a) and (b) show placement of information in connect with boundary sample data.
Figure 10B:
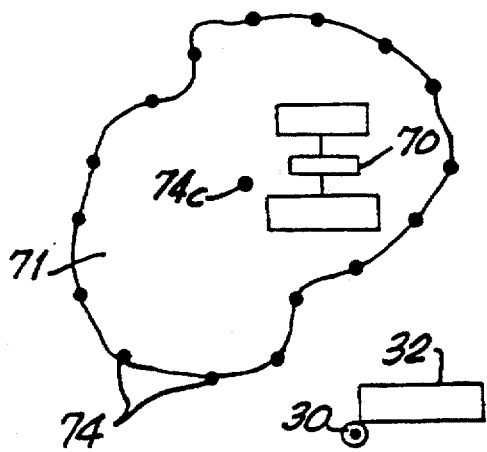

Referring to FIGS. 10(a) and 10(b), another type of datum which may be placed on the digitized map surface is a connected set of field rectangles 70 which identify a bounded area 71 comprised of boundary sample points 74. On a map, such areas may be a forest, national park or the like. These boundary sample points 74 also influence other field rectangles 32 as neighbors as described above.

A center point 74c weakly attracts the field rectangle set 70 with a spring force to keep it within the bounded area. Each boundary sample point 74 also repels the field rectangle set 70.

The force on the set 70 is the sum of the forces on all the field rectangles in the set. Thus, in calculating the forces on the field rectangle set 70, the sum of the half-lengths and half-widths of all the rectangles in set 70 are used. Each field rectangle in set 70 is viewed separately from the set 70 for purposes of calculating the force effect of neighboring field rectangles. In positioning the set 70, however, it is viewed as a unit and the vector distance 72 between each field rectangle in set 70 is preserved.

If the set of field rectangles 70 can fit within the area framed by the boundary points 74 as shown in FIG. 10(b), the weakly attractive spring force from point 74c tends to keep the field rectangle set 70 as close as possible to the point 74c. The area framed is said to be semi-permeable in the sense that if it is too small to accommodate the set of field rectangles 70, as shown in FIG. 10(a), the field rectangles 70 are able to overlay the boundary. In the case of a collision of a one of the field rectangle set 70 with the boundary, the repulsive force is not as strong as the hardcore repulsive force experienced in the case of a collision between a field rectangle and another field rectangle or a symbol. Instead of multiplying the repulsive force by a factor of 5 as in the case of a hard core repulsion between labels, it is multiplied only by a factor of 2 in the illustrated embodiment for such collisions with bounded area boundaries during the incremental integration cycle. This allows the field rectangle set 70 to overlap the boundary more easily if it is difficult to place it within the boundary.

In a second, and preferred, embodiment of the invention, a modified version of the placement system of the invention more fully implements accepted cartographic standards, for example, the well-known Imhoff standards.

In this version of the system, the field rectangle associated with each location symbol is initially subjected to a procedure referred to herein as "static placement". According to this procedure, the field rectangle is positioned at the target radius about its associated symbol at the location where the sum of the absolute values of the forces acting on the field rectangle is at a minimum. In the above described first embodiment of the invention, the target radius is approximated by the equilibrium position where the spring forest and repulsive symbol label-label force are equal and opposite. However, since the field rectangle has square corners, this is not the true target radius at all positions around the symbol. The target radius must vary at different orientations around the symbol in accordance with the dimensions of the field rectangle and the symbol, so that the closer edge or corner of the field rectangle is the appropriate distance from the symbol as specified, for instance, by the Imhoff standards.

This miminization procedure is implemented by the sampling the force field of sum of the absolute values of the magnitudes of the forces acting on the field rectangle at a sufficient number of positions at the target radius around the symbol to sufficiently define such force field so that its minimum can be found. In the illustrated embodiment of the invention 16 positions at the target radius around the symbol are sufficient. Those positions are not equally spaced around the symbol since the rate of change of the force field is higher when the vertical portions of the symbol and field rectangle are adjacent to one another than when the horizontal portions are adjacent. Thus more points are selected in these high rate of change areas.

Figure 13:
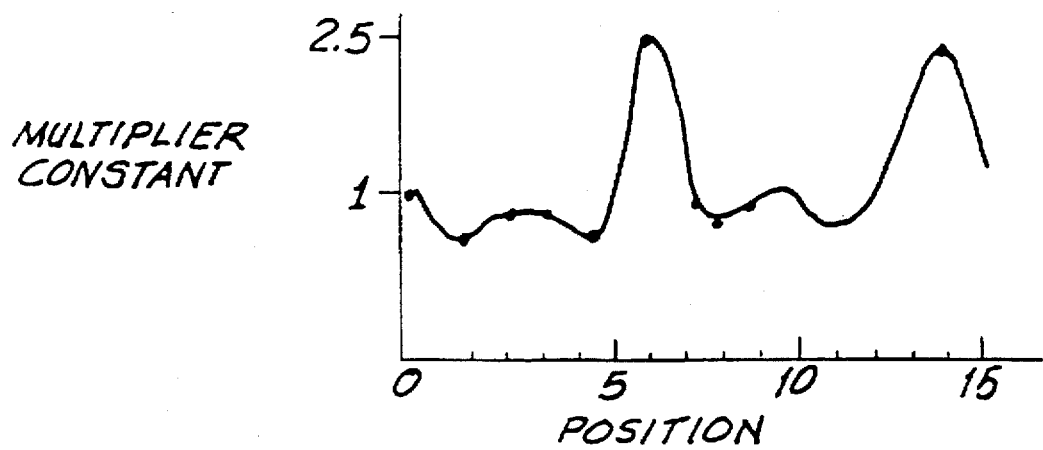
FIG. 13 is a graph of the Imhoff weighing factors at positions around a symbol.

In order to implement the Imhoff (or other relevant) standards, the sums of the absolute values of the forces at the target radius around the symbol are weighted according to the desirability of placing a field rectangle at that position according to the standards. As shown in FIG. 13, if the optimal position according to Imhoff standards is position 0, then the other positions are weighted, such that undesirable positions, for instance position 6, have significantly increased final force values.

Figure 14:
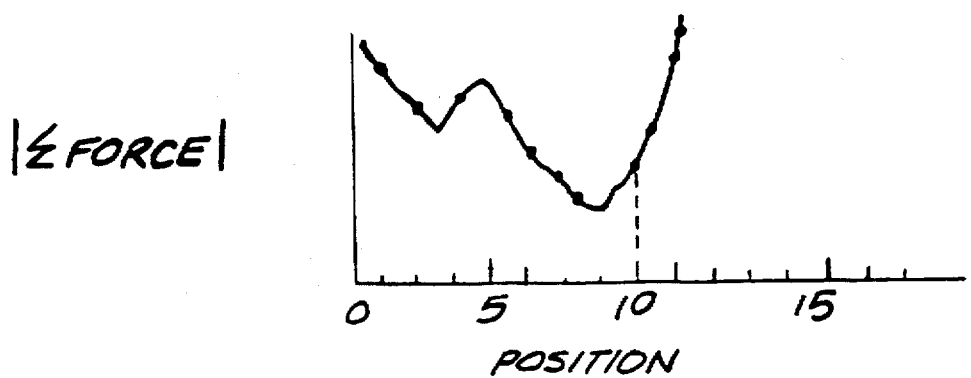
FIG. 14 is an exemplary graph of the sums of the absolute values of forces on a field rectangle at various positions around a symbol.

An exemplary graph of final force value versus position is shown in FIG. 14. The final force values at all sixteen sampled positions are compared and the field rectangle is placed at the position at which the final force value is smallest. The function is then minimized locally at the selected position using known minimizing techniques, for instance by golden mean division, to obtain an absolute minimum. The field rectangle is then placed at the target radius at the minimum force position. This procedure is repeated for the field rectangles of each location symbol.

The order in which this static placement procedure is implemented on the field rectangles is determined by first surveying the sums of the absolute values of magnitude of the forces acting on each of the field rectangles in their positions immediately before static placement is performed, and then performing the static placement on each field rectangle in decreasing order of such sums. In the first run of static placement described above, the preferred Imhoff position may be used as the initial position of the field rectangles.

During static placement the force magnitude multipliers used in the case of collisions are increased over those used during the incremental integration period, in order to make the system more intolerant to collisions during this portion of the process. In the illustrated embodiment, the hard core label-label and label-symbol repulsive forces are multiplied by 5000 rather than 5, and the bounded area boundary overlap force is multiplied by 500 instead of by 2.

The first static placement establishes initial conditions for a first run of incremental integration which is performed as described above for the first embodiment of the invention, except that the checking of the amount of movement of the field rectangles during the last few increments of the integration period is not performed.

After the first integration period, a second static placement is performed in the same manner as described above for the first static placement. This is followed by a second incremental integration cycle which is performed in the same manner as the first one described above for this second embodiment of the invention, except that the integration period is divided into many more time increments than the first integration (in the illustrated embodiment, 250 increments vs. 100 increments for the first integration). The shortening of the integration increment renders the system more stable, so that the amplitude of the movements of the field rectangles is substantially less than in the first integration period. The same effect may be achieved by adjusting the constants of the force equations, or by both shortening the increments and adjusting the constants. The more stable system is appropriate because the second integration is effectively an optimization of the results of the first integration period.

A third static placement is performed after the second run of integration. For each field rectangle, the sum of the absolute values of the forces on the field rectangles at the position determined to be the best by the third static placement is then compared with the sum of the absolute values of the magnitudes of the forces calculated at the position where the field rectangle was positioned by the second run of integration. If the calculated sum for the field rectangle at the static placement position is more than that at the position determined by the second round of integration, the field rectangle is placed at the integration determined position, unless this would make the distance of the near edge of the field rectangle more than three symbol radii from the associated symbol. In such case, the best static placement solution is chosen.

If, at the end of this third static placement, some field rectangles are still experiencing collisions, or if the sum of the absolute values of the magnitudes of the forces of a field rectangle at a given position is above a predetermined value, an optional second order static placement may be performed before the need for manual intervention by an operator is indicated. This second order static placement procedure generally provides some improvement in the placement of all field rectangles. Thus, even if there are no colliding field rectangles, second order static evaluation may be performed as an option.

In second order static placement, a first field rectangle is studied to determine which other field rectangle is colliding with At or exerting the most force upon it. The first field rectangle is then placed at its target radius position having the minimum sum of absolute values of force magnitudes. Such most offensive field rectangle is then moved to its target radius position having the minimum sum of absolute values of force magnitudes. Next static placement is performed on the first field rectangle. If the total force it feels is still not below the predetermined value, or if it is still colliding, the field rectangle is tagged for operator intervention.

According to another aspect of the invention, there is provided an improved method for smoothing of line work on a surface, such as a map, in order to optimally generalize line work such as coastlines or rivers when it is desired to prepare a smaller scale version of the map. In such smaller scale versions detailed characteristics of lines are successively eliminated as the scale of the depiction becomes smaller. Such smoothing must be accomplished, however, without losing the essential characteristics of the line work at the particular scale.

Figure 15:
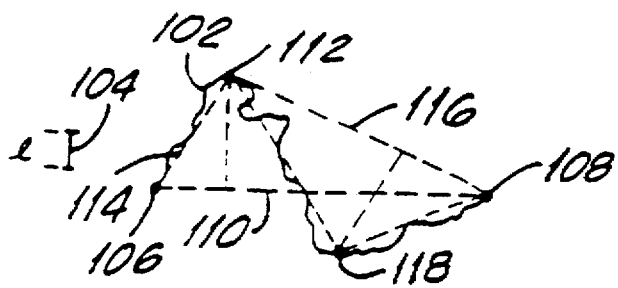
FIG. 15 shows the manner in which smoothing of linework is accomplished.

Referring to FIG. 15 of the drawings, there is shown a fractally curved line 102 on a surface which might represent, for instance, a coastline or a river on a map. In order to smooth the fractal curve 102 to a length "1", shown at 104, a minimal set of points along the curve 102 is constructed by a known cartographer's method that recursively, between any two endpoints so far determined (initially there are just the two endpoints of the curve), determines another end point: namely, that point along the curve between the two endpoints which is at the farthest distance from the chord joining the two endpoints. This recursive processing of the segments is continued until for each chord joining adjacent endpointsthe maximum distance between the chord and any point on the segment of the curve between the endpoints is smaller than 1. This results in a set of points along the curve which, in prior methods, were then joined by straight or smoothly curved line segments.

The endpoints 106 and 108 of curve 102 are joined by the chord shown as the dotted line 110. The point along the curve 102 farthest from the chord 110 is point 112. Once point 112 is located, it acts as a new end point and chords 114 and 116 are constructed joining respectively endpoints 106 to 112 and 112 to 108. No portion of the segment of curve 102 between endpoints 106 and 112 is farther than 1 from chord 114. Therefore, no further endpoints are determined along this segment.

The end point farthest from chord 116 is point 118 which is farther than 1 from the chord 116, and hence a new endpoint. Therefore, two new cords are constructed joining endpoints 112 to 118 and 118 to 108. Since no portions of the segments of the curve 102 between the endpoints 112 and 118 or 118 and 108 are farther than 1 from the respective cords, no further endpoints are determined. According to the prior method the endpoints 106, 112, 118 and 108 are then joined by a straight or a smoothly curved line segments.

This prior method is insufficient, since, when smooth curves are passed through points determined by this method, even using splining methods to determine the smooth curves, it does not always result in a curve which agrees within the resolution 1 with the original curve, and can moreover result in curves that appear qualitatively incorrect to the observer.

Figure 16:
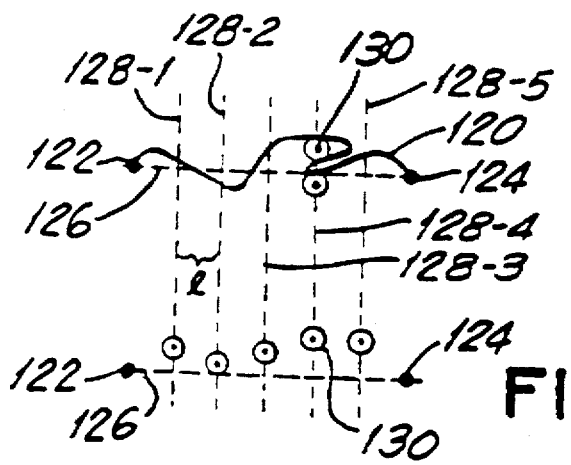
FIG. 16 shows the manner in which new oversampled points are determined in accordance with the invention.

Referring to FIG. 16, in order to overcome this problem in accordance with the present invention, the solution determined by the prior method described above is taken and each segment of the curve between adjacent endpoints is "oversampled" by adding new points between such endpoints. The added points are perpendicular displacements from locations spaced at a distance not greater than 1 apart along the chord joining the endpoints of the segment. The magnitude of each displacement is calculated as the average value of the perpendicular distance between the curve and the chord in the portion of the curve between the locations along the chord adjacent to the location in question.

FIG. 16 shows the segment 120 of the original curve between the endpoints 122 and 124 which are joined by the chord 126. The new points for the smooth curve in the segment are determined by segmenting the chord 126 into sections of length 1 by perpendicular segmenting lines 128-1 through 128-5. The displacement of the new point from the chord 126 at segmenting line 128-4 is calculated by determining the average value of the displacement of the curve 120 from the chord 126 in the segment extending from segmenting line 128-3 to 128-5, and is illustrated as point 130. In similar manner, the new points for each of the dividing lines 128-1 through 128-3 and 128-5 are determined and are shown plotted directly below the curve 120 in FIG. 16.

The over-sampled set of new points is now used to determined an arc cubic spline for the segment of the curve 120 extending from endpoints 122 to 124. In accomplishing this the x coordinate set $(x_i)$ and the Y coordinate set $(y_i)$ are each independently splined to be smooth functions of the arc length S along the curve where the value of $s_i$ for new point $x_i$, $y_i$ is taken as the linear polygonal arclength along the over-sampled new points.

$$S_i = \sum_{j=1}^{i} \sqrt{dx_j^2 + dy_j^2} \quad , \tag{15}$$

$$dx_j = x_j - x_{j-1} > dy_j = y_j - y_{j-1}$$

Figure 17A:
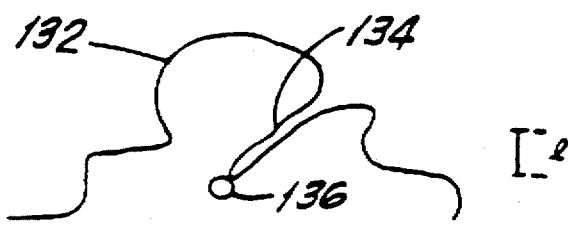
FIGS. 17(a) and (b) shows the effect of prior methods of smoothing coastline data.
Figure 17B:
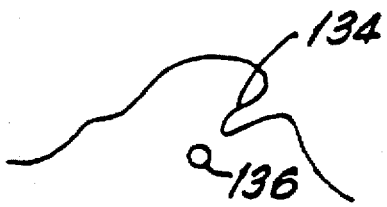

All required sampling, local tangents, curvatures, etc. are now computed from the spline. The smoothing technique of the present invention has substantial advantages over other techniques such as Fourier filtering, particularly in its adherence to spatially singular conjunctions. For example, referring to FIGS. 17(a) and 17(b) of the drawings, if a coastline 132 which includes a fjord 134 having a town 136 located at the end of it is to be smoothed to resolution 1 by Fourier filtering, the smooth coastline illustrated in FIG. 17(b) may shorten the length of the fjord 134 so that it no longer touches the town 136, thereby showing the town as being landlocked. In the method of the present invention, the actual point at the end of the fjord remains as a point along the final smooth spline until the resolution scale 1 grows longer than the length of the fjord.

The aforesaid method has been described in two dimensions. It will be understood by those of ordinary skill in the art that it can be applied to a three or "n" dimensional system by adding appropriate terms to the equations for each additional dimension and having a three dimensional isotropic or anisotropic retarding force, corresponding to the frictional retarding force of the disclosed embodiment, for example a viscous fluid. For simplicity of calculation it is preferred that the retarding force be defined by a first order differential equation, although higher order equations can be used. The coulomb repulsive forces in general act as $$\frac{1}{d_{n-1}}$$

where d is the distance between the objects and n is the number of dimensions. A three dimensional version can be used for determining the packing of objects in a three dimensional space, for instance. While the illustrated embodiment of the invention is described with relation to cartographic applications, it is clear that the techniques of the present invention could also be applied to other fields where it is desired to automatically position objects on a surface or in a space in accordance with particular predetermined relationships with each other.

Although the locations described in the disclosed embodiment are fixed on the surface it would also be possible to use locations which are movable. In three dimensional packing embodiments of the invention and in other two dimensional embodiments it is possible to have only objects with repulsive forces acting among neighboring ones of them and attractive forces acting on all or some neighboring ones of them.

In some applications, particularly when the density of locations is not high, the initial static placement of field rectangles on a surface such as a map provides a good solution to the placement problem and it is not necessary to preform the incremental integration steps.

I claim:

1. A method for automatically smoothing a fractally curved line to a length 1, said line having two endpoints and representing a lineal cartographic feature on the surface of a map and being represented by a series of sample points in the memory of a digital computer, while retaining the larger scale characteristics of importance of the line, comprising the steps of:

recursively defining a new endpoint on the line between any two adjacent endpoints so far determined by locating a point on said line which is the farthest perpendicular distance from a chord joining such endpoints so far determined so long as such farthest perpendicular distance is at least of length 1;

segmenting each chord joining adjacent endpoints into sections of length not greater than 1 by defining locations along the chord;

defining new points between adjacent endpoints along a line perpendicular to the chord at each such location, such new points being displaced from the chord by a distance equal to the average value of the perpendicular distance of the line from the chord in the segment of the chord between the locations or endpoints adjacent to such location;

fitting an arc-length splined curve through such endpoints and said new points to define a smooth line; and generating a display of such smoothed line.

* * * * *